(12) United States Patent
Leinenbach et al.

(10) Patent No.: US 6,521,390 B1
(45) Date of Patent: Feb. 18, 2003

(54) FLEXOGRAPHIC PRINTING ELEMENT COMPRISING AN IR-ABLATABLE LAYER WITH IMPROVED SENSITIVITY

(75) Inventors: Alfred Leinenbach, Ludwigshafen (DE); Sabine Philipp, Mörfelden-Walldorf (DE); Eddy Daems, Mortsel (BE); Hieronymus Andriessen, Mortsel (BE); Luc Leenders, Mortsel (BE)

(73) Assignees: BASF Drucksysteme GmbH, Stuttgart (DE); Agfa Gevaert N.V., Mortsel (BE)

( * ) Notice: Subject to any disclaimer, the term of this patent is extended or adjusted under 35 U.S.C. 154(b) by 65 days.

(21) Appl. No.: 09/613,720

(22) Filed: Jul. 11, 2000

(30) Foreign Application Priority Data

Jul. 13, 1999 (EP) .............................. 99113770

(51) Int. Cl.[7] .............................. G03C 1/76; G03F 9/00; G03F 7/028; G03F 7/032; G03F 7/095; G03F 7/30
(52) U.S. Cl. .................. 430/273.1; 430/306; 430/5; 430/281.1; 430/944; 430/911; 101/395; 101/401.1
(58) Field of Search ............... 101/395, 401.1, 101/401; 430/273.1, 281.1, 285.1, 283.1, 306, 911, 944, 5

(56) References Cited

U.S. PATENT DOCUMENTS

| 5,480,762 A | * | 1/1996 | Toyama et al. ............. 430/302 |
| 5,719,009 A | | 2/1998 | Fan ............................. 430/306 |
| 6,037,102 A | | 3/2000 | Loerzer et al. ............. 430/306 |

FOREIGN PATENT DOCUMENTS

| EP | 654 150 | 5/1995 |
| EP | 741 330 | 11/1996 |
| EP | 803 770 | 10/1997 |

OTHER PUBLICATIONS

U.S. Ser. No. 08/721,545 (equivalent to EP 767 407).
Deutscher Drucker Nr. 21/3.6.99, p. w12 to w16 (no English translation available).

* cited by examiner

Primary Examiner—Janet Baxter
Assistant Examiner—Sin J. Lee
(74) Attorney, Agent, or Firm—Keil & Weinkauf

(57) ABSTRACT

Photosensitive printing element for preparing flexographic printing plates via computer-to-plate technology with a support, a photopolymerizable layer and an IR-ablatable layer substantially opaque to actinic radiation which comprises at least one heat-combustible polymeric binder, at least one IR-absorbing material and at least one aliphatic diester, and a process for making a flexographic printing plate using such an element.

15 Claims, No Drawings

FLEXOGRAPHIC PRINTING ELEMENT COMPRISING AN IR-ABLATABLE LAYER WITH IMPROVED SENSITIVITY

DESCRIPTION

This invention relates to a photosensitive printing element used for preparing flexographic printing plates via computer-to-plate technology with a support, a photopolymerizable layer and an IR-ablatable layer substantially opaque to actinic radiation which comprises at least one heat-combustible polymeric binder, at least one IR-absorbing material and at least one aliphatic diester. Furthermore, this invention relates to a process for making a flexographic printing plate using such an element.

In the field of flexographic printing, computer-to-plate-technology (CtP technology), also known as digital imaging technology, is becoming extremely popular. In CtP technology the photographic mask used in conventional techniques to cover such areas of a photopolymeric printing plate which should not polymerize is substituted by a mask integrated within the printing plate. Although there are several possibilities of providing such an integrated mask only two techniques are on the market, namely printing the mask on the photopolymeric plate with an ink jet printer or coating the photopolymeric plate with an IR-ablatable layer which is substantially opaque to actinic radiation and imaging such a mask with an IR laser. Such an IR-ablatable layer usually contains carbon black. Photopolymeric printing plates with such IR-ablatable layers are known in the art and disclosed for instance in EP-A 654 150 or EP-A 767 407. By means of irradiation with an IR laser the black layer is evaporated at this location and the photopolymer layer below is bared. The laser apparatus is directly coupled with the lay-out computer system. Using this technique an image can be generated directly on the plate, which in the next step is irradiated with actinic radiation.

CtP technology not only avoids having to make separate photomasks and working with photochemicals, but also gives a much higher resolution. For a detailed discussion of the advantages of CtP technology over conventional technology see for instance "Deutscher Drucker, Nr. 21/3.6.99, pages w12 to w16".

The crucial step in the process of making a flexographic printing plate using a photopolymeric printing element with IR-ablatable layer is the step of irradiating the element with the IR-laser The IR-ablatable layer has to fulfil several requirements in order to obtain good results. For economic reasons the time for imaging the IR-ablating layer should be as short as possible. Therefore, its sensitivity to IR radiation should be as high as possible. Furthermore, the common technology nowadays for imaging uses a laser apparatus with a rotary drum. The photopolymeric flexographic element is mounted on the cylindrical drum and irradiated with the laser beam while the drum rotates at up to 2000 rpm. For this reason, the IR-ablatable layer of the flexographic printing element also has to be of an elastomeric character in order to permit bending the flexographic printing element without the IR-ablatable layer wrinkling or ruptering.

EP-A 654 150 discloses a photopolymeric flexographic printing element with an IR-ablatable layer. The IR-ablative layer disclosed comprises an IR-absorbing material. Furthermore, it optionally comprises a polymeric binder and a wide variety of other ingredients such as dispersants for pigments, surfactants, plasticizers, or coating aids. However, the above mentioned publication does not teach anything about the sensitivity of the IR-ablatable layer. Particularly, it does not teach how to improve the sensitivity of the IR-ablatable layer and simultaneously also to improve its flexibility in order to mount it on cylindrical drums without problems.

EP-A 767 407 discloses photopolymeric printing elements with an IR-ablatable layer comprising an elastomeric, film-forming binder and carbon black. As binders polyamides (e.g. Macromelt®) or polyvinyl/alcohol/polyethylene/glycol graftpolymers (e.g. Mowiol®) are mentioned. Although such binders permit mounting the flexographic printing elements on the cylindrical drums without problems the velocity of the imaging process is insufficient.

The problem of obtaining improved photopolymeric flexographic printing plates whose IR-ablatable layers simultaneously show high sensitivity and high flexibility still remains unsolved. It was an object of the present invention to provide such photopolymeric flexographic printing elements.

In a first embodiment, this invention relates to a photosensitive printing element used for preparing flexographic printing plates via computer-to-plate technology comprising
   a support,
   a photopolymerizable layer comprising at least one elastomeric binder, at least one polymerizable compound, and at least one photoinitiator or photoinitiator system,
   an IR-ablatable layer which is substantially opaque to actinic radiation, and
   optionally a peelable flexible coversheet,
wherein the IR-ablatable layer comprises at least one heat-combustible polymeric binder, at least one IR-absorbing material and at least one aliphatic diester of the general formula $R_1(CO)[O—CHR_3—CH_2]_nO(CO)R_2$ where n=1–30, $R_1$ and $R_2$ are straight-chain or branched alkyl chains with 1–20 carbon atoms, and $R_3$ is H or methyl.

In a second embodiment, this invention relates to a process for making a flexographic printing plate using such an element.

Surprisingly, it has been found that by combination of heat-combustible polymeric binders with such special plasticizers photopolymeric flexographic printing plates are obtained whose IR-ablatable layers show an excellent sensitivity to IR-radiation, resulting in high imaging velocities and simultaneously also exhibit very high flexibility so that that the elements can be mounted on the cylindrical drum of a laser apparatus without the IR-ablatable layer wrinkling or rupturing.

Suitable supports for the photosensitive elements of the present invention are flexible but dimensionally stable materials such as films of polyethylene terephthalate, polyethylene naphthalate, polybutylene terephthalate or polycarbonate that have a sufficiently high modulus of elasticity for use as a dimensionally stable support material.

The photopolymerizable layer comprises at least one elastomeric binder, at least one polymerizable compound, and at least one photoinitiator or photoinitiator system. Such photopolymerizable layers are well known in the flexographic printing art and are disclosed for instance in EP-A 767 407. Although the photopolymerizable layer is referred to herein as a single layer, it will be understood that two or more different photopolymerizable layers can be used.

The elastomeric binder can be a single polymer or a mixture of polymers. Examples of suitable binders are vinylaromatic/diene copolymers or block copolymers such as conventional S-B-S- or S-I-S- block copolymers, diene/ acrylonitrilecopolymers, ethylene/propylene/diene-copolymers, ethylene/acrylic acid copolymers or diene/acrylate/acrylic acid copolymers. Suitable polymerizable compounds are conventional photopolymerizable ethylenically monounsaturated or polyunsaturated organic compounds as are used for producing photopolymeric printing plates and are compatible with the elastomeric binder. Examples of suitable monomers are conventional acrylates or methacrylates of mono- or polyfunctional alcohols, acryl- or methacrylamides, vinyl ethers, or vinyl esters. Examples of preferred monomers are butyl(meth)acrylate, 2-ethylhexyl(meth)acrylate, lauryl(meth)acrylate, butanediol-di(meth)acrylate, hexanediol-di(meth)crylate, ethylene glycol di(meth)acrylate or polyethylene oxide-di(methacrylates). Examples of suitable photoinitiators are aromatic keto compounds such as benzoin or benzoin derivatives. The photopolymerizable layer may additionally comprise further additives such as plasticizers, thermal polymerization inhibitors, dyes or antioxidants.

By appropriately choosing the ingredients of the photopolymerizable layer the skilled artisan can make the photopolymerizable layer soluble or dispersible in aqueous, semi-aqueous or organic developers, depending on the solubility properties desired.

The essential constituent of the photopolymeric flexographic printing element according to the present invention is its novel IR-ablatable layer on top of the photopolymerizable layer comprising at least one heat-combustible polymeric binder, at least one IR-absorbing material and at least one aliphatic diester. The IR-ablatable layer is substantially opaque to actinic radiation. In general, its optical density for actinic radiation is greater than 2.5, preferably greater than 3.5. Said optical density is obtained at the wavelength or in the wavelength range of the actinic light used for flood exposure of the photopolymerizable element through the imaged IR-ablatable layer. Although the IR-ablatable layer is referred to herein as a single layer, it will be understood that two or more different IR-ablatable layers can be used.

The polymeric binder can be effectively removed by the heat generated by the IR-absorbing material when the layer is exposed to IR-laser radiation. The term "heat-combustible" means that the binder decomposes, depolymerizes or evaporates without a preceding melting step. Therefore, the respective elements of the image have very steep edges, resulting in high resolution.

Although any kind of binder which fulfils the abovementioned requirement may be used within the scope of this invention, it is preferred that the heat-combustible binder comprises nitro or nitrate ester groups. Suitable binders within the scope of this invention are especially such polymeric materials which are usually known as components of propellants.

Examples of such binders include poly (glycidyl azide), poly (glycidyl nitrate) or poly (vinyl nitrate). Further examples include nitro derivatives of polystyrene, such as polymers comprising nitro-, dinitro- or trinitrostyrene-groups. The polystyrene may additionally be nitro-substituted in the main chain or only nitro-substituted in the main chain. Other examples comprise derivatives of polyacrylates or polymethacrylates such as polymers comprising 2,4-dinitrophenyl acrylate or p-nitrophenylacrylate as monomers.

Of special interest as heat-combustible binders are nitrate esters of cellulose or cellulose derivatives such as cellulose ethers. Such binders are preferred within the scope of the present invention. Cellulose nitrate esters, also known as nitrocellulose, are commercially available (e.g. Hercules or Wolff-Wals-rode) with different degrees of esterification up to the maximum substitution degree of 3 nitrate ester groups per monomer. The degree of esterification not only influences the combustion properties of cellulose nitrate ester but also its solubility properties. Depending on the nature of the developer which is intended to be used, the skilled artisan may choose types which are readily soluble in esters and hydrocarbons or types which are readily soluble in alcohols.

It is also possible to use nitrate esters derived from cellulose ethers such as methyl cellulose, ethyl cellulose and especially 2-hydroxyethyl cellulose, 2-hydroxypropyl cellulose, or carboxy-methyl cellulose. Nitrated carboxymethyl cellulose might also be used as sodium salt, enhancing the water solubility of the binder. It is also possible to use mixtures of two or more heat-combustible binders. In general, the amount of the heat-combustible binder in the IR-ablatable layer is 20–80%, preferably 30–70%, by weight based on the total amount of all ingredients of the IR-ablatable layer.

As another component the IR-ablatable layer according to the present invention contains an aliphatic diester of the general formula $R_1(CO)[O—CHR_3—CH_2]_nO(CO)R_2$. The esters function as plasticizers. Without such plasticizers it is not possible to obtain IR-ablatable layers with elastomeric properties which can be bent without wrinkling or rupturing. The diesters are derived from ethylene glycol, propylene glycol, their oligomers and polymers; $R_3$ can be H or the methyl group. The polymerization number n can be between 1 and 30, preferably n is between 1 and 10 and most preferably between 2 and 6. $R_1$ and $R_2$ are straight-chain or branched alkyl chains with 1–20, preferably 5–11 carbon atoms. The two groups can be equal, giving a symmetrical diester, or different giving an asymmetrical diester. In particular, examples for $R_1$ and $R_2$ are methyl, ethyl, n-propyl, isopropyl, n-butyl, isobutyl, t-butyl, n-pentyl, n-heptyl, n-hexyl, 2-ethylhexyl, n-heptyl, n-octyl, n-nonyl, n-decyl or n-undecyl groups. Examples of preferred diesters comprise n-pentyl or n-heptyl groups; triethyleneglycol-hexanonic acid diester, triethylenglycol-2-ethyl-hexanoic acid diester and triethyleneglycol-octanonic acid diester are particularly preferred. It is also possible to use mixtures of two or more diesters. In general, the amount of diester in the IR-ablatable layer is 1–30%, preferably 5 to 20%, by weight based on the total amount of all ingredients of the IR-ablatable layer.

Furthermore the IR-ablatable layer comprises at least one IR-absorbing material evenly distributed within the layer which should have a strong absorption between 750 and 20000 nm. Suitable IR-absorbing materials include IR-absorbing dyes such as phthalocyanines and substituted phthalocyanine derivatives, cyanine dyes, merocyanine dyes and polymethine dyes or intensely colored inorganic pigments such as carbon black, graphite, iron oxide or chromium oxide. It is preferred to use carbon black. Carbon black also ensures that the IR-ablatable layer is opaque to actinic radiation, so that is not absolutely necessary to add an additional UV-absorbing dye. It is desirable to use small particles for maximum color strength. Particularly preferred are fine-grained carbon black brands with a mean particle size below 30 nm. Examples of suitable brands are Printex® U, Printex® L6, Spezialschwarz 4 or Spezialschwarz 250 of Degussa. In general, the amount of the IR-absorbing material in the IR-ablatable layer is 1–60% by weight based on the total amount of all ingredients of the IR-ablatable layer. It is preferred to use 10–50%, and particularly preferred in the 25–50% range.

The IR-ablatable layer may optionally contain additional components and additives. Examples of such components are additional polymeric binders which need not be heat-combustible, dispersants for pigments, fillers, surfactants or coating aids. Such additives can be chosen by the skilled artisan according to the desired properties of the layer, provided, however, that they do not adversely affect the imaging properties of the IR-ablatable layer. Suitable as dispersants for carbon blacks are especially polyoxyalkylene derivatives such as Solperse® grades (Zeneca) or block copolymers such as Disperbyk®-grades (Byk). It is also possible to use as additives UV-absorbing materials, or dyes which absorb in the UV. Using UV-absorbing materials frequently is advantageous also with carbon black as IR absorber, with other IR absorbers it might be unavoidable. Although not restricted to that number, it is preferred for the amount of such additives no to exceed 20%, preferably 10%, by weight based on the total weight of all ingredients of the IR-ablatable layer.

Preferably, the ingredients of the IR-ablatable layer are chosen such that the IR-ablatable layer is soluble or at least swellable also in the developer solution for the photopolymeric layer although the invention is not restricted to that embodiment.

It is frequently advantageous to cover the photosensitive printing element with a peelable flexible coversheet on the IR-ablative layer in order to protect the element, although such a protective coversheet is not absolutely necessary.

In addition, it is also advantageous although not required to use at least one of the abovementioned additional binders as release improving polymers making it easier to remove the coversheet without damaging the IR-ablatable layer. Examples of suitable binders for this purpose include certain polymethylmethacrylates such as Plexigum®, vinylacetate-crotonic acid copolymers, hydroxypropylcellulose, polyvinylpyrrolidones such as Luviskol®, polystyrenes such as Supranol®, chlorinated PVC, methylphenylsilicones or polyethylene waxes.

The photopolymeric flexographic printing element may also comprise optionally one or more additional layers between the abovementioned layers. Examples of such layers are well known in the art and include adhesive layers, especially between the support and the photopolymerizable layer, intermediate layers between the photopolymerizable layer and the IR-ablatable layer, to prevent diffusion of monomers or other small molecules from diffusion from one layer into the other one, or detackifying layers.

The photosensitive flexographic printing element according to the present invention is generally manufactured by first preparing the photopolymerizable and optionally additional layers on the support and then applying the IR-ablatable layer by coating or by lamination techniques. It is also possible to use a commercially available photopolymerizable flexographic printing plate, to peel off its protective film and then to apply the IR-ablatable layer in the same manner as mentioned above.

In a first step of manufacturing photosensitive flexographic printing elements with an IR-ablatable layer all ingredients of the IR-ablatable layer are dissolved in an appropriate solvent or, alternatively when a pigment such as carbon black is used, a dispersion of the pigment in an appropriate solvent and the other ingredients is prepared. In the latter case the use of a dispersant is frequently recommendable. Such a solution or dispersion can be directly coated on the photopolymerizable layer followed by evaporation of the solvent. Alternatively, the solution or dispersion can be coated on a support, such as a PET sheet, followed by evaporation of the solvent. Thereafter, the coated support is laminated together under pressure and/or heat with the photopolymerizable layer of the printing element such that the photopolymerizable layer is adjacent to the IR-ablatable layer. The support for the IR-ablatable layer now serves as protective film for the entire photopolymeric printing element.

The process for preparing a flexographic printing plate using the photosensitive printing element of the present invention involves removing—if present—the protective film from the photosensitive printing element. Thereafter, the IR-ablatable layer is imagewise irradiated by means of an IR laser to form a mask on the photopolymerizable layer. Examples of suitable IR lasers are Nd/YAG lasers (1064 nm) or diode lasers (e.g. 830 nm). Suitable laser systems for computer-to-plate-technology are commercially available, for instance the diode laser system OmniSetter® (Fa. Misomex, wavelength of the laser: 830 nm, working width 1800 mm) or the Nd/YAG laser system digilas® (Fa. Schepers) each comprising a rotatable cylindrical drum on which the photosensitive flexographic printing elements with IR-ablatable layer are mounted. The image information is directly transferred from the layout computer system to the laser apparatus.

After writing in a mask into the IR-ablatable layer the photosensitive printing element is overall exposed to actinic radiation through the mask. Advantageously, this can be done directly on the laser cylinder. Alternatively, the plate is removed from the laser apparatus and irradiated in a conventional flat bed irradiation unit. In the course of the irradiation step the photosensitive layer polymerizes in such areas which had be bared in the foregoing ablation step whereas no photopolymerization takes place in such areas which are still covered by the IR-ablative layer opaque to radiation. As disclosed in EP-A 767 407 it is advantageous to perform the irradiation with actinic light in the presence of atmospheric oxygen though irradiation with exclusion of oxygen under a conventional vacuum frame also is possible.

Thereafter the irradiated element is developed to give a flexographic printing plate. The development step can be performed in conventional development units. Depending on the nature of the plate, aqueous or organic solvent or solvents mixtures may be used. In the course of the development step the non-polymerized areas of the photosensitive layer and the residues of the IR-ablatable layer are removed. It is also possible to remove the residues of the IR-ablatable layer with one solvent or solvent mixture first and to develop the photosensitive layer with another developer. After the development step the printing plates obtained are dried. Typical conditions for elements with PET base film are 1–4 h at 45–65° C. Elements with PEN base films can be dried at temperatures even higher than 65° C. without loss of dimensional stability, resulting in shorter drying times. Several aftertreatment operations might be applied in addition, such as irradiation with UV-C light or treatment with $Br_2$ in order to detakkify the printing plate.

The photosensitive flexographic printing elements according to the present invention show excellent flexibility. They can be bent without the IR-ablatable layer wrinkling or rupturing, which means that the elements can be mounted on laser drums without problems. Furthermore, they are by far more sensitive to IR laser radiation than conventional printing elements, permitting accelerated imaging of the plate.

The examples which follow are intended to illustrate the present invention without restricting its scope.

EXAMPLE 1

Preparation of the IR-ablatable Layer

A dispersion of carbon black, nitrocellulose and a plasticizer was prepared using the following ingredients:

| component | amount | weight % except MEK | |
|---|---|---|---|
| Special Schwarz | 2.3 g | 33.3% | carbon black pigment |
| Nitrocellulose | 3.6 g | 52.2% | E 950, Wolff Walsrode (Germany) |
| Solsperse 5000 | 0.05 g | 0.7% | dispersion agent, Zeneca Ltd. |
| Solsperse 28000 | 0.025 g | 3.6% | dispersion agent, Zeneca Ltd. |
| Plasthall 4141 | 0.7 g | 10.2% | Plasticizer comprising triethylene glycol dihexanoate and triethylene glycol dioctanoate (C. P. Hall, Chicago IL) |
| Methylethyl-ketone | 93.1 g | — | |

The dispersion was applied to a PET film (thickness 125 μm) by means of a 50 μm coating knife and the solvent allowed to evaporate yielding an even and tack-free coating with a specific coating weight of 3 g/m² and an optical density in the actinic region of 3.7.

EXAMPLE 2

Preparation of a Photopolymeric Flexographic Printing Plate with IR-ablative Layer The PET protective film of a photopolymeric flexographic printing plate (Nyloflex® FAR 284 (BASF)) composed of a PET support, a photopolymerizable layer and a polyamide layer, and the said PET protective film was peeled off. The polyamide layer was removed from the photopolymerizable layer using a conventional adhesive tape.

The IR-ablative layer as prepared in example 1 and the flexographic printing plate were laminated together in a Codor LPP650 laminator at a temperature of about 40° C., giving a plate which comprises a PET support, a photopolymerizable layer and an IR-ablatable layer. The PET film on which the dispersion of example 1 had been coated now serves as a new protective film.

EXAMPLES 3–6

IR-ablation of the Photopolymeric Plate

The PET protective film was peeled off from the photopolymeric plate obtained in example 2. The black IR-ablatable layer remained completely on the photopolymeric layer. The plate could be bent repeatedly to an angle of 90° without the IR-ablatable layer wrinkling or rupturing.

The plate was imaged with a NdYLF laser emitting at 1064 nm. The image plane power was set between 200 and 450 mW maximum respectively with intervals of 50 mW. A spot size of 22 μm was used together with a pitch of 11 μm and a scan speed of 4 m/s. A digital image was formed on the plate. Table 1 lists the results of the exposed sample.

TABLE 1

| | | Decrease in optical density after irradiation of the plate | | |
|---|---|---|---|---|
| | Power [mW] | initial optical density in UV | optical density in UV after irradiation | difference |
| example 3 | 300 | 3.67 | 0.44 | 3.23 |
| example 4 | 350 | 3.67 | 0.3 | 3.37 |
| example 5 | 400 | 3.67 | 0.23 | 3.44 |
| example 6 | 450 | 3.67 | 0.21 | 3.46 |

EXAMPLE 7

Preparation of a Flexographic Printing Plate

The entire photopolymeric flexographic printing plate covered with a digitally imaged mask as obtained in example 6 was irradiated with actinic light for 15 min and thereafter developed in conventional manner in a drum brush washer using the commercially available developer solution nylosolv II®. During the development step the residues of the IR-ablatable layer and the non-irradiated areas of the photopolymerizable layer were removed, leaving the irradiated areas. After development the flexographic printing plate was dried for 2 h at 60° C., irradiated with UV-C light to detackify it and finally post-irradiated with actinic light for 10 min.

All test elements on the printing plate were correctly formed.

EXAMPLE 8

Irradiation on a Rotary Drum

The protective film and the polyamide substrate layer of a commercially available photopolymeric flexographic printing plate (Nyloflex® FAR 284 (BASF)) were removed. On the surface of the plate an IR-ablatable layer according to example 1 was laminated.

After removing the PET-film the photopolymeric plate covered with an IR-ablatable layer was mounted on the rotary drum of a Nd-YAG laser apparatus (Schepers digilas®, 60W). No wrinkling or rupturing was observed. The plate was digitally imaged while rotating the drum at 1600 rpm. The laser power was increased from 20% to 80% in 5% steps. A power of 30% turned out to be sufficient to correctly form all test elements on the printing plate, i.e. the black IR-ablatable layer was completely removed at tho se locations hit by the laser beam.

COMPARATIVE EXAMPLE 1

The procedure of example 1 was repeated, but a conventional IR-ablatable layer with an optical density of 3.5, prepared from 35 weight % black carbon and 65 weight % of a n elastomeric polyamide binder (Makromelt® 6900) was used. No wrinkling or rupturing was observed, but the laser power necessary to correctly form all test elements was 60%.

Example 8 and Comparative Example 1 show that the IR-ablatable layers according to the present invention have a sensitivity twice as high as in conventional systems at a comparable optical density.

EXAMPLES 9–11

These examples demonstrate the additional benefit of suitable secondary binders on the proerties of the flexographic printing elements of the present invention.

IR-ablatabe layers were prepared using the procedures as described in example 1 and using the compositions of table 2. In examples 10 and 11 respectively, around 35% of the nitrocellulose has been substituted by release improving polymers respectively.

TABLE 2

Amounts of components for making the IR-ablatabel layers of examples 9–11

|  | example 9 | | example 10 | | example 11 | |
| --- | --- | --- | --- | --- | --- | --- |
| component | amount | weight % except MEK | amount | weight % except MEK | amount | weight % except MEK |
| Special Schwarz | 2.04 g | 34.0% | 2.04 g | 34.0% | 2.04 g | 34.0% |
| Nitrocellulose | 3.08 g | 51.3% | 2.0 g | 33.3% | 2.0 g | 33.3% |
| Solsperse 5000 | 0.04 g | 0.7% | 0.04 g | 0.7% | 0.04 g | 0.7% |
| Solsperse 28000 | 0.2 g | 3.3% | 0.2 g | 3.3% | 0.2 g | 3.3% |
| Plasthall 4141 | 0.64 g | 10.7% | 0.64 | 10.7% | 0.64 g | 10.7% |
| PMMA (Plexigum M 345) | — | — | 1.08 g | 18.0% | — | — |
| Vinylacetate-crotonic acid copolymer (Mowilith CT 5) | — | — | — | — | 1.08 g | 18.0 g |
| Methylethyl-ketone | 54 g | | 54 g | | 54 g | |

Table 2: Amounts of components for making the IR-ablatable layers of examples 9–11.

The IR-ablatable layers were used for preparing flexographic printing elements according to the procedures described in example 2 and IR-ablated according to example 3.

The results are given in Table 3:

TABLE 3

Decrease in optical density in the UV after IR-ablation of the plate

| | release of PET-film | initial optical density in UV | optical density in UV after irradiation with IR-laser | | | difference/ reduction of optical density at 300 W |
| --- | --- | --- | --- | --- | --- | --- |
| | | | 300 W | 350 W | 400 W | |
| example 9 | good | 4.35 | 0.33 | 0.23 | 0.18 | 4.02/−92% |
| example 10 | excellent | 4.40 | 0.38 | 0.23 | 0.12 | 4.02/−91% |
| example 11 | excellent | 4.10 | 0.34 | 0.21 | 0.16 | 3.76/−92% |

Examples 9–11 demonstrate that substituting around 35% of nitrocellulose by release improving polymers does not impart the sensitivity of the IR-ablatable layer to ablation significantly. The release of the protective PET-film on top of the flexographic printing element is significantly improved.

What is claimed is:

1. Photosensitive printing element used for preparing flexographic printing plates via computer-to-plate technology comprising
   a support,
   a photopolymerizable layer comprising at least one elastomeric binder, at least one polymerizable compound, and at least one photoinitiator or photoinitiator system,
   an IR-ablatable layer which is substantially opaque to actinic radiation, and
   optionally a peelable flexible coversheet,
   wherein the IR-ablatable layer comprises at least one heat-combustible polymeric binder, at least one IR-absorbing material and at least one aliphatic diester of the general formula $R_1(CO)[O-CHR_3-CH_2]_nO(CO)R_2$ where $n=1-30$, $R_1$ and $R_2$ are straight-chain or branched alkyl chains with 1–20 carbon atoms, and $R_3$ is H or methyl.

2. Photosensitive printing element according to claim 1 wherein the IR-aborbing material is carbon black.

3. Photosensitive printing element according to claim 1 wherein the aliphatic diester is at least one selected from the group of triethyleneglycol-hexanoic acid diester, triethylenegly-col-2-ethyl-hexanoic acid diester and triethyleneglycol-octanoic acid-diester.

4. Photosensitive printing element according to claim 1 wherein the IR-ablatable layer comprises at least one additional polymeric binder.

5. Photosensitive printing element according to claim 4 wherein the additional binder is present in an amount of less than 20% by weight based on the total of all ingredients of the IR-ablatable layer.

6. Process for making a flexographic printing plate using the element of claim 1 comprising
   (a) optionally removing the peelable flexible coversheet,
   (b) imagewise irradiating the IR-ablatable layer with an IR-laser to form a mask,
   (c) overall exposing the photosensitive element to actinic radiation through the mask,
   (d) treating the product of step (c) with at least one developer solution to remove the residues of the IR-ablatable layer which were not removed during step (b) and to develop the photopolymerizable layer.

7. Process according to claim 6 wherein for step (b) a laser apparatus with a rotary drum is used and for irradiation with the IR-laser the flexographic printing element is mounted on the cylindrical surface of the drum.

8. A photosensitive printing element used for preparing a flexographic printing plate via computer-to-plate technology comprising
   a support,
   a photo-polymerizable layer comprising at least one elastomeric binder, at least one polymerizable compound, and at least one photoinitiator or photoinitiator system,
   an IR-ablatable layer which is substantially opaque to actinic radiation, and
   optionally a peelable flexible coversheet,
   wherein the IR-ablatable layer comprises at least one heat-combustible polymeric binder which comprises nitro or nitrate-ester groups, at least one IR-absorbing material and at least one aliphatic diester of the general formula $R_1(CO)[O-CHR_3-CH_2]_nO(CO)R_2$ where $n=1-30$, $R_1$ and $R_2$ are straight-chain or branched alkyl chains with 1–20 carbon atoms, and $R_3$ is H or methyl.

9. The photosensitive printing element defined in claim 8 wherein the heat-combustible polymeric binder is a nitrate ester of cellulose or a cellulose ether.

10. The photosensitive printing element defined in claim 8 wherein the IR-absorbing material is carbon black.

11. The photosensitive printing element defined in claim 8 wherein the aliphatic diester is at least one selected from the group of triethyleneglycol-hexanoic acid diester, triethylenegly-col-2-ethyl-hexanoic acid diester and triethyleneglycol-octanoic acid diester.

12. The photosensitive printing element defined in claim 8 wherein the IR-ablatable layer comprises at least one additional polymeric binder.

13. The photosensitive printing element defined in claim 12 wherein the additional binder is present in an amount of less than 20% by weight based on the total of all ingredients of the IR-ablatable layer.

14. A process for making a flexographic printing plate using the element defined in claim 8 comprising (a) optionally removing the peelable flexible coversheet, (b) imagewise irradiating the IR-ablatable layer with an IR laser to form a mask, (c) overall exposing the photosensitive element to actinic radiation through the mask, (d) treating the product of step (c) with at least one developer solution to remove the residues of the IR-ablatable layer which were not removed during step (b) and to develop the photo-polymerizable layer.

15. The process of claim 14 wherein for step (b) a laser apparatus with a rotary drum is used and for irradiation with the IR-laser the flexographic printing element is mounted on the cylindrical surface of the drum.

* * * * *